United States Patent
Chen et al.

(10) Patent No.: US 8,110,753 B2
(45) Date of Patent: Feb. 7, 2012

(54) CIRCUIT BOARD ASSEMBLY

(75) Inventors: Wei-Cheng Chen, Changhua County (TW); Cheng-Chao Liao, Taichung (TW)

(73) Assignee: Universal Scientific Industrial Co., Ltd., Nan-Tou Hsien (TW)

( * ) Notice: Subject to any disclaimer, the term of this patent is extended or adjusted under 35 U.S.C. 154(b) by 850 days.

(21) Appl. No.: 12/081,099

(22) Filed: Apr. 10, 2008

(65) Prior Publication Data

US 2009/0255721 A1    Oct. 15, 2009

(51) Int. Cl.
*H05K 1/11* (2006.01)
*H01R 13/58* (2006.01)

(52) U.S. Cl. ......... 174/262; 174/261; 174/263; 439/458

(58) Field of Classification Search .................. 174/251, 174/72 A, 261–263; 361/826; 439/456, 439/457, 458
See application file for complete search history.

(56) References Cited

U.S. PATENT DOCUMENTS

| | | | | |
|---|---|---|---|---|
| 3,419,670 A | * | 12/1968 | Schneider | 174/135 |
| 6,093,036 A | * | 7/2000 | Tohgo et al. | 439/83 |
| 6,663,414 B2 | * | 12/2003 | Kume et al. | 439/458 |

* cited by examiner

*Primary Examiner* — Timothy Thompson
*Assistant Examiner* — Sherman Ng
(74) *Attorney, Agent, or Firm* — Morgan, Lewis & Bockius LLP

(57) ABSTRACT

A circuit board assembly includes: a circuit board having opposite first and second surfaces and formed with a first through-hole defined by a hole-defining wall that extends between and that terminates at the first and second surfaces and that cooperates with the first and second surfaces to define first and second turns, respectively, the circuit board further having an abutting wall that extends between and that terminates at the first and second surfaces and that cooperates with the second surface to define a third turn; and an electric wire having a fixed end that is soldered to the circuit board, extending through the first through-hole, and passing over the first, second and third turns of the circuit board so as to form an inflection region between the first and second turns.

2 Claims, 6 Drawing Sheets

CIRCUIT BOARD ASSEMBLY

BACKGROUND OF THE INVENTION

1. Field of the Invention

This invention relates to a circuit board assembly, more particularly to a circuit board assembly including a circuit board and an electric wire soldered to the circuit board and formed with an inflection region.

2. Description of the Related Art

FIGS. 1 and 2 illustrate a conventional circuit board assembly that includes a circuit board 1 and an electric wire 2 having a fixed end 201 soldered to the circuit board 1 through a solder 3, a curved segment 203 extending from the fixed end 201 to a through-hole 101 in the circuit board 1, and a free segment 202 extending from the curved segment 203. The conventional circuit board assembly is disadvantageous in that the fixed end 201 of the electric wire 2 is likely to be strained when the free segment 202 of the electric wire 2 is pulled by an external force (referring to the arrow in FIG. 2). As a consequence, the fixed end 201 of the electric wire 2 tends to break off from the solder 3 or the solder 3 tends to break after a period of use.

SUMMARY OF THE INVENTION

Therefore, an object of the present invention is to provide a circuit board assembly that can overcome the aforesaid drawback associated with the prior art.

According to this invention, a circuit board assembly comprises: a circuit board having opposite first and second surfaces and formed with a first through-hole defined by a hole-defining wall that extends between and that terminates at the first and second surfaces and that cooperates with the first and second surfaces to define first and second turns, respectively, the circuit board further having an abutting wall that extends between and that terminates at the first and second surfaces, that is spaced apart from the hole-defining wall, and that cooperates with the second surface to define a third turn; and an electric wire having a fixed end that is soldered to the circuit board, extending through the first through-hole, and passing over the first, second and third turns of the circuit board so as to form an inflection region between the first and second turns.

BRIEF DESCRIPTION OF THE DRAWINGS

Other features and advantages of the present invention will become apparent in the following detailed description of the preferred embodiments of the invention, with reference to the accompanying drawings, in which.

DETAILED DESCRIPTION OF THE PREFERRED EMBODIMENTS

Figure 1:
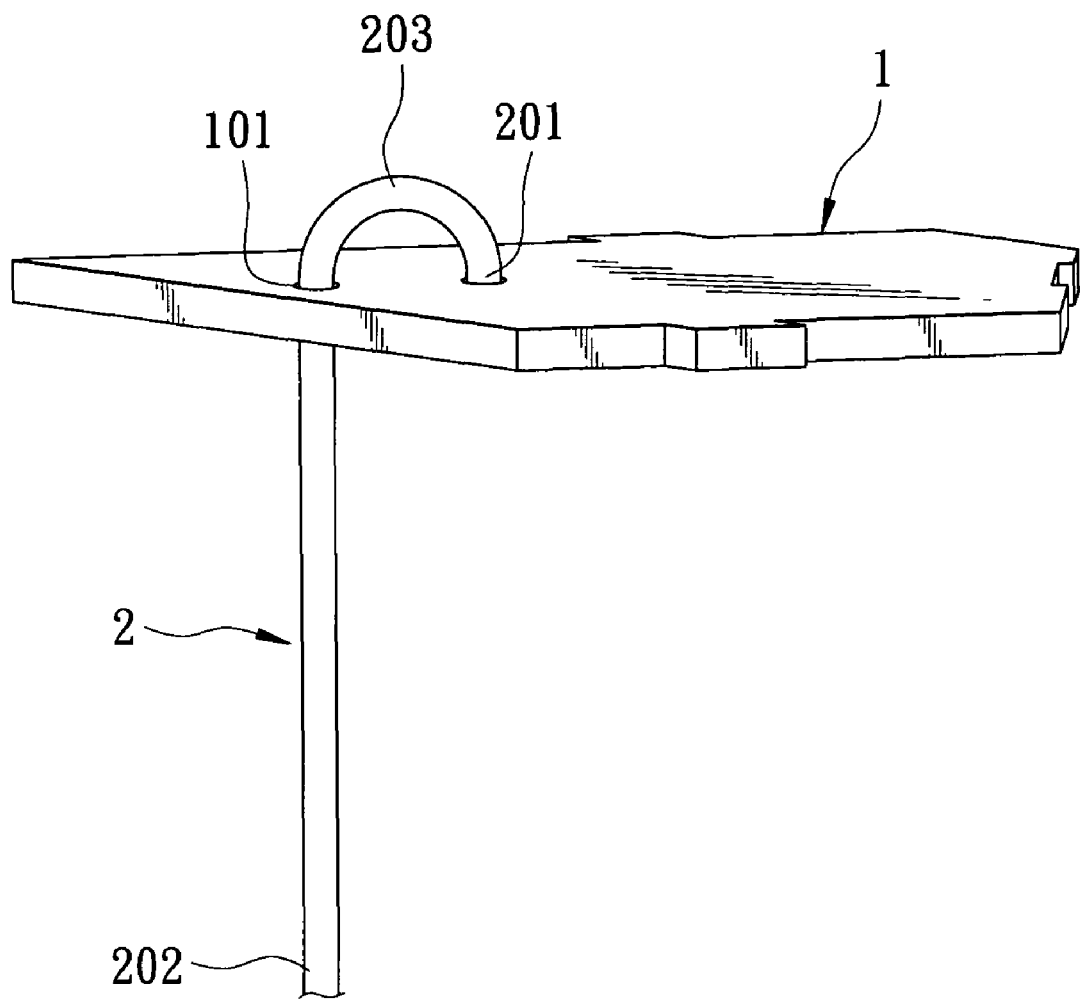
FIG. 1 is a fragmentary perspective view of a conventional circuit board assembly.
Figure 2:
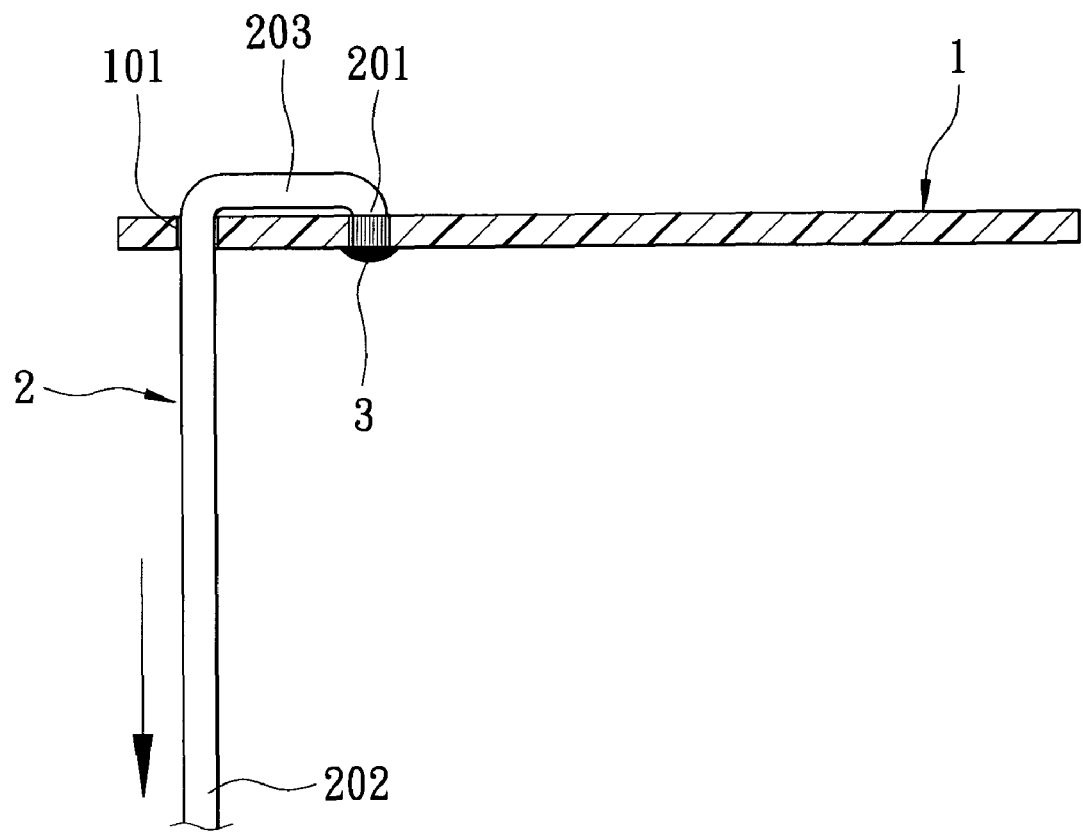
FIG. 2 is a fragmentary partly sectional view of the conventional circuit board assembly.

Before the present invention is described in greater detail with reference to the accompanying preferred embodiments, it should be noted herein that like elements are denoted by the same reference numerals throughout the disclosure.

Figure 3:
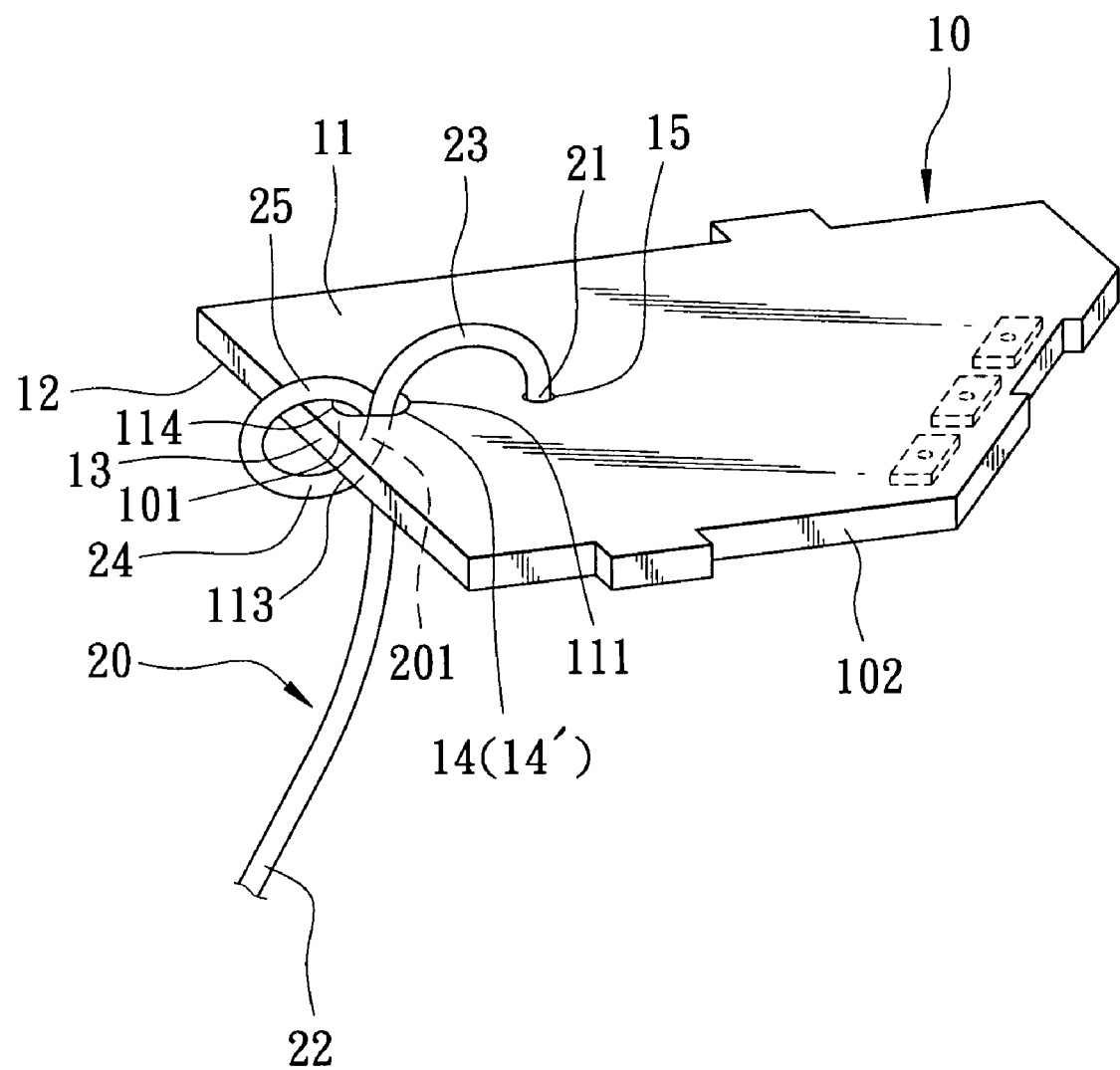
FIG. 3 is a fragmentary perspective view of the first preferred embodiment of a circuit board assembly according to this invention.
Figure 4:
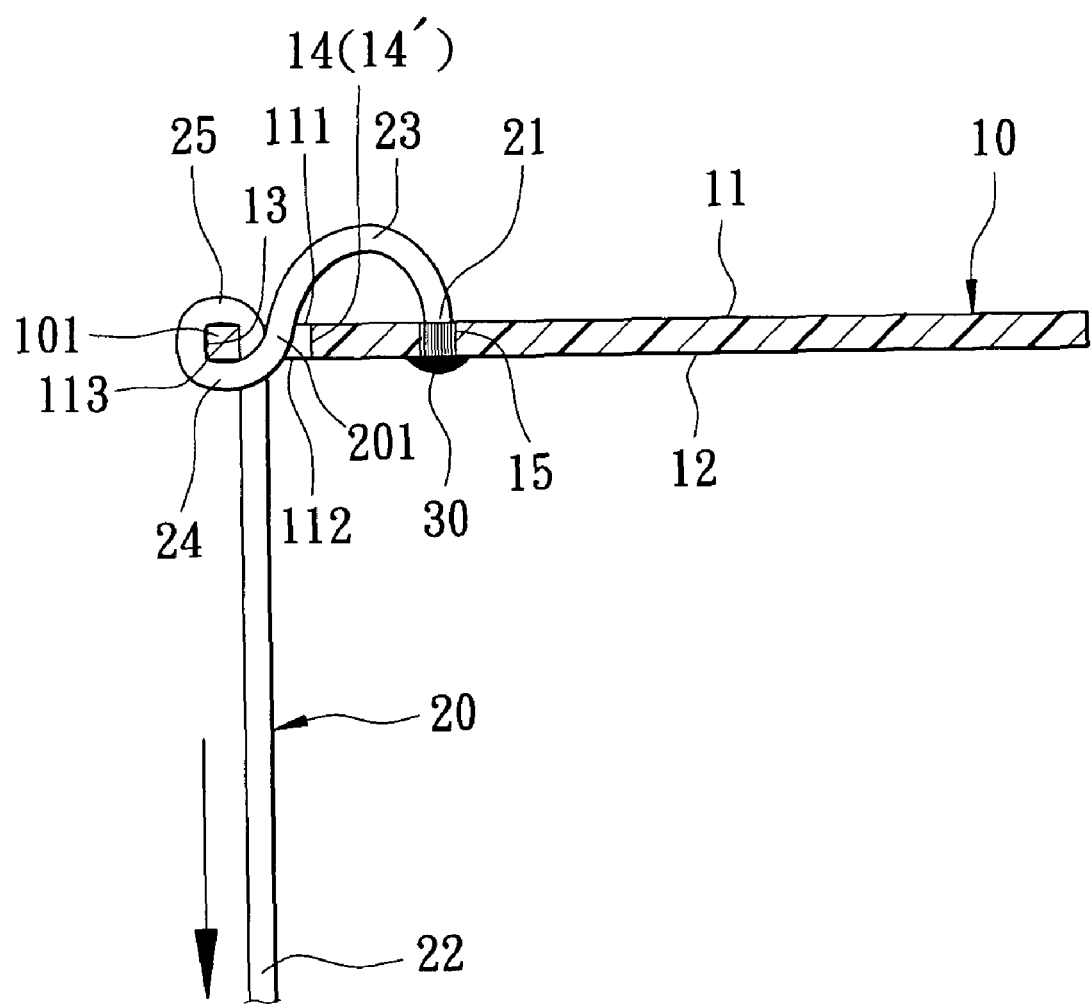
FIG. 4 is a fragmentary partly sectional view illustrating a state where an electric wire of the first preferred embodiment is pulled by an external force.

FIGS. 3 and 4 illustrate the first preferred embodiment of a circuit board assembly according to the present invention. The circuit board assembly includes: a circuit board 10 having opposite first and second surfaces 11, 12 and formed with a first through-hole 14 defined by a hole-defining wall 14' that extends between and that terminates at the first and second surfaces 11, 12 and that cooperates with the first and second surfaces 11, 12 to define first and second turns 111, 112, respectively, the circuit board 10 further having an abutting wall 13 that extends between and that terminates at the first and second surfaces 11, 12, that is spaced apart from the hole-defining wall 14', and that cooperates with the second surface 12 to define a third turn 113; and an electric wire 20 having a fixed end 21 that is soldered to the circuit board 10 through a solder 30, extending through the first through-hole 14, and passing over the first, second and third turns 111, 112, 113 of the circuit board 10 so as to form an inflection region 201, i.e., a transition region where such a change from convex to concave or conversely takes place, between the first and second turns 111, 112.

In this embodiment, the electric wire 20 has a first curved segment 23 extending from the fixed end 21 to the inflection region 201, and a second curved segment 24 extending from the inflection region 201 to the third turn 113 of the circuit board 10. The first and second curved segments 23, 24 are bent in opposite directions, and are disposed at the first and second surfaces 11, 12, respectively.

In this embodiment, the abutting wall 13 of the circuit board 10 is defined by a peripheral end 102 of the circuit board 10, and further cooperates with the first surface 11 to define a fourth turn 114. The electric wire 20 further passes over the fourth turn 114, and further extends repeatedly through the first through-hole 14 in the circuit board 10 so as to form an open loop 25 trained on a portion 101 of the circuit board 10 that extends from the hole-defining wall 14' of the first through-hole 14 to the abutting wall 13.

The circuit board 10 is further formed with a retaining hole 15. The fixed end 21 of the electric wire 20 is fixed in the retaining hole 15 through the solder 30.

In use, when a free segment 22 of the electric wire 20 is pulled by an external force (referring to the arrow in FIG. 4), the loop 25 will be continuously reduced in size until it is tightly sleeved on the portion 101 of the circuit board 10 (see FIG. 4), thereby preventing the first curved segment 23 of the electric wire 20 from being undesirably strained.

Figure 5:
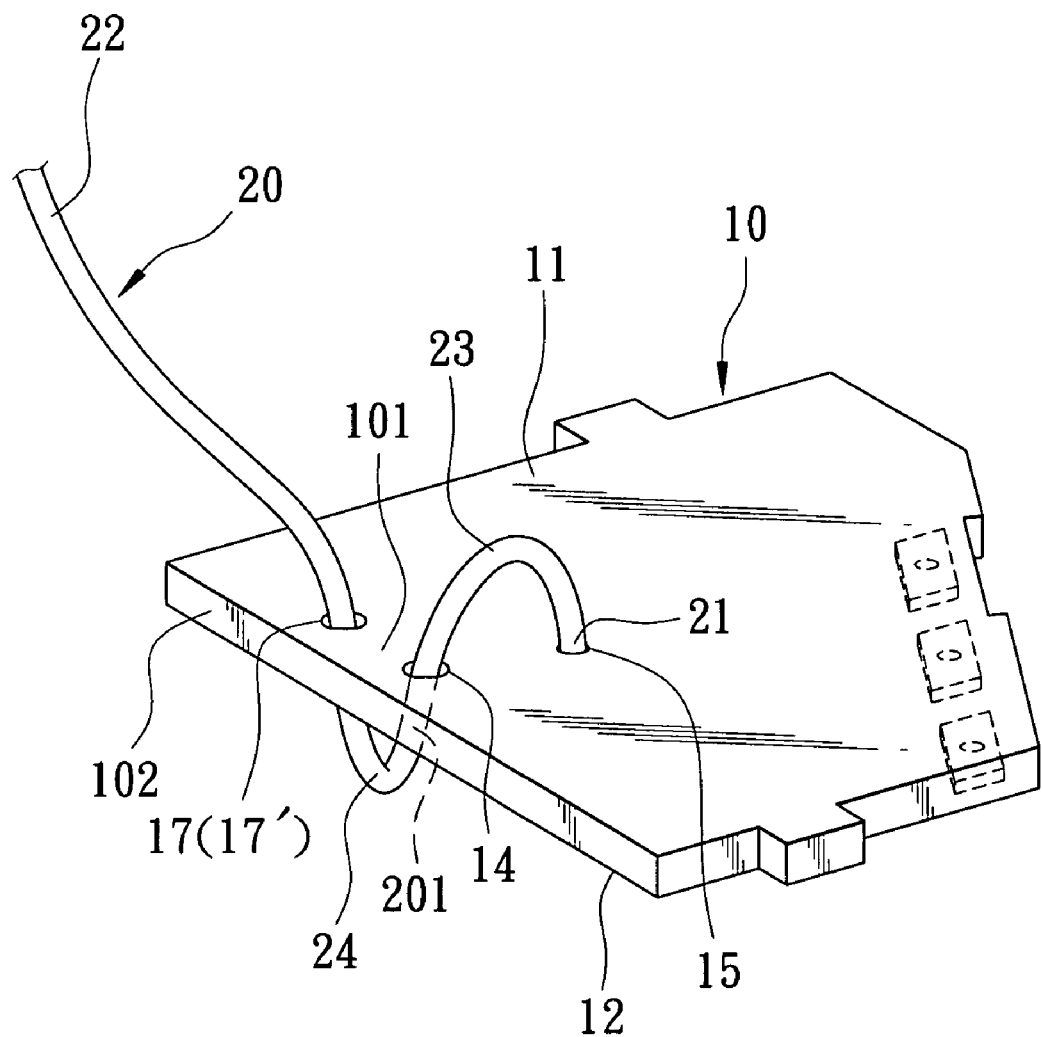
FIG. 5 is a fragmentary perspective view of the second preferred embodiment of the circuit board assembly according to this invention.
Figure 6:
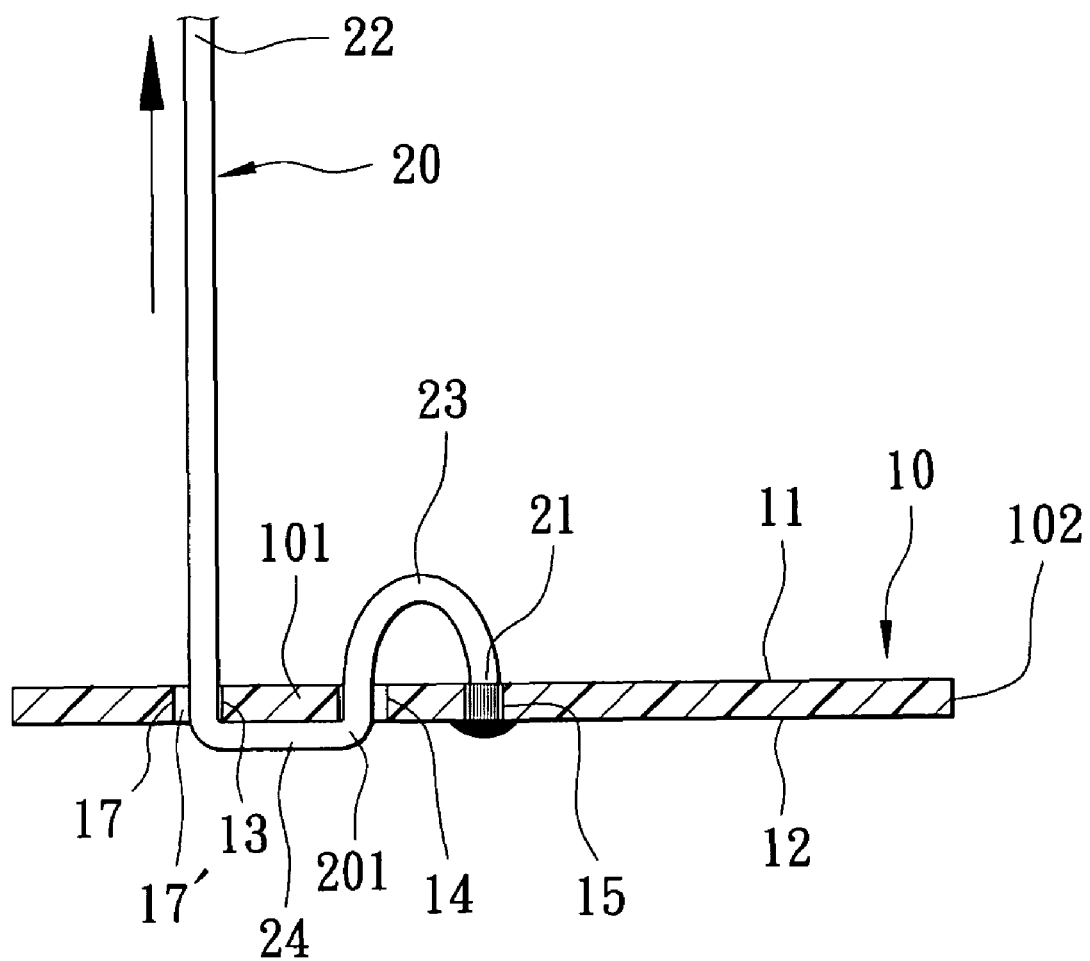
FIG. 6 is a fragmentary partly sectional view illustrating a state where the electric wire of the second preferred embodiment is pulled by an external force.

FIGS. 5 and 6 illustrate the second preferred embodiment of the circuit board assembly according to this invention. The second preferred embodiment differs from the previous embodiment in that the circuit board 10 is further formed with a second through-hole 17 defined by a hole-defining wall 17' that defines the abutting wall 13 of the circuit board 10.

In use, when an external force is applied to the free segment 22 of the electric wire 20 (see FIG. 6), the electric wire 20 will be tightly trained on a portion 101 of the circuit board 10 that extends from the hole-defining wall 14' of the first through-hole 14 to the hole-defining wall 17' of the second through-hole 17, thereby preventing the fixed end 21 of the electric wire 20 from being undesirably strained.

By forming the inflection region 201 of the electric wire 20 and by training the electric wire 20 on the portion 101 of the circuit board 10 of the circuit board assembly of this invention, the aforesaid drawback associated with the prior art can be eliminated.

While the present invention has been described in connection with what are considered the most practical and preferred embodiments, it is understood that this invention is not limited to the disclosed embodiments but is intended to cover various arrangements included within the spirit and scope of the broadest interpretations and equivalent arrangements.

What is claimed is:

1. A circuit board assembly comprising:

a circuit board having opposite first and second surfaces, an outer peripheral edge that interconnects said first and second surfaces and that defines an abutment wall, a first through-hole extending through said first and second surfaces near said abutment wall, a retaining hole extending through said first and second surfaces, said first through-hole being disposed between said retaining hole and said abutment wall; and an electric wire having a fixed end that is soldered to said circuit board at said retaining hole, a first curved segment connected to said fixed end and extending over said first surface from said retaining hole to said first through-hole, an inflection region connected to said first curved segment and extending through said first through-hole from said first surface to said second surface, a second curved segment connected to said inflection region and extending over said second surface from said first through-hole to said abutment wall, and an open loop that is connected to said second curved segment and that turns around said abutment wall to extend back to said first surface and to pass through said first through-hole from said first surface to said second surface, wherein said circuit board has no portion that extends beyond said open loop and that extends around one side of said open loop opposite to said abutment wall.

2. The circuit board assembly of claim 1, wherein said fixed end extends into said retaining hole.

\* \* \* \* \*